United States Patent [19]

Nguyen et al.

[11] Patent Number: 5,183,784
[45] Date of Patent: Feb. 2, 1993

[54] SILVER-GLASS PASTES

[75] Inventors: My N. Nguyen, San Diego, Calif.; Chee-Kong Lee, Singapore, Singapore; Thomas L. Herrington, Ramona, Calif.

[73] Assignee: Johnson Matthey Inc., Valley Forge, Pa.

[21] Appl. No.: 760,454

[22] Filed: Sep. 17, 1991

Related U.S. Application Data

[63] Continuation-in-part of Ser. No. 482,489, Feb. 21, 1990, Pat. No. 5,075,262.

[51] Int. Cl.$^5$ .............................................. C03C 8/18
[52] U.S. Cl. .................................... 501/19; 106/1.14; 501/22
[58] Field of Search ................ 501/19, 20, 22, 24, 501/46; 106/1.14; 252/512, 514

[56] References Cited

U.S. PATENT DOCUMENTS

| | | | |
|---|---|---|---|
| 3,350,341 | 10/1967 | Short | 501/43 |
| 3,374,110 | 5/1964 | Miller | 106/1.05 |
| 3,776,769 | 12/1973 | Buck et al. | 252/514 |
| 3,898,091 | 8/1975 | Stout | 501/20 |
| 4,401,767 | 8/1983 | Dietz et al. | 501/19 |
| 4,419,279 | 12/1983 | Abrams | 106/1.18 |
| 4,436,785 | 3/1984 | Dietz et al. | 501/19 |
| 4,459,166 | 7/1984 | Dietz et al. | 501/19 |
| 4,636,254 | 1/1987 | Husson et al. | 106/1.19 |
| 4,657,589 | 4/1987 | Barajas | 106/1.19 |
| 4,761,224 | 8/1988 | Husson et al. | 106/1.19 |
| 4,933,030 | 6/1990 | Dietz | 106/1.14 |
| 4,986,849 | 1/1991 | Nguyen et al. | 106/1.14 |
| 4,996,171 | 2/1991 | Davey et al. | 501/19 |
| 5,075,262 | 12/1991 | Nguyen et al. | 501/19 |

Primary Examiner—Mark L. Bell
Assistant Examiner—Deborah Jones
Attorney, Agent, or Firm—Cushman, Darby & Cushman

[57] ABSTRACT

An improved silver-glass paste for bonding a semiconductive element to a substrate comprising a metal resinate. A surfactant containing lyophilic and lyophobic groups may also be included.

9 Claims, No Drawings

SILVER-GLASS PASTES

This is a Continuation-In-Part of U.S. Pat. application No. 07/482,489, filed on Feb. 21, 1990 now U.S. Pat. No. 5,075,262.

BACKGROUND OF THE INVENTION

The present invention relates to improved silver-glass paste compositions useful for attaching semiconductive elements, e.g., silicon dies, to appropriate substrates, and to a method for forming electronic components using such pastes.

Prior patents directed to similar pastes include U.S. Pat. Nos. 3,497,774; 4,401,767; 4,436,785; 4,459,166; 4,636,254 and U.S. Pat. No. 4,761,224. Typically, these pastes are used for attaching silicon dies to ceramic substrates.

Other improved silver-glass paste compositions are described in U.S. Ser. No. 07/248,120, filed Sept. 23, 1988 now U.S. Pat. No. 4,986,849, and U.S. Pat. No. 4,996,171, the subject matter of the application and patent being incorporated herein by reference.

The pastes known in the art typically include the following essential components in the approximate ranges indicated below:

| Component | % by weight |
| --- | --- |
| silver flake | 55-80 |
| glass frit (e.g. lead borate glass) | 10-25 |
| resin or resin-forming component (e.g. a methacrylate) | 0.0-2 |
| organic vehicle | 5-20 |

Other additives, e.g., silver oxide, thixotropic agents, or the like also may be included.

In a representative die-attachment process, the paste comprising silver flake, glass frit, resin and vehicle is placed in a cavity in a ceramic substrate, the die is placed on the paste and the resulting die/substrate package is fed on a belt onto and through a furnace where the package is heated to remove the organic vehicle and sinter the residual silver and glass to bond the die firmly to the substrate. The final bond layer must be completely free of voids and, as a consequence, the process usually requires a preliminary drying step in which vehicle is evaporated, followed by firing in a furnace to remove residual vehicle and melt the glass.

The preliminary drying step of necessity is quite lengthy, requiring between about 2-10 hours at 60°-80° C., depending on, for example, the size of the die and the surface area of the silver flake particles. Additionally, the ramp rate, i.e., the rate at which the package is fed from the drying step into the furnace, is carefully controlled so as to ensure that organic burnout is at least essentially completed before the sintering of the silver-glass mix takes place. Relatively low temperature (e.g., up to 50° C./minute) ramp rates are very commonly used to insure vehicle removal and optimum results. Belt-type furnaces are normally employed for the firing stage and, depending on the number of temperature zones involved, the dwell time in the furnace can vary from 30-90 minutes or more.

When a large die is bonded, e.g., a die of 400-500 square mils or more, a large amount of bonding agent is needed, and, consequently, a significant amount of vehicle must be evaporated. To insure sufficient evaporation of the vehicle, the drying process may be particularly lengthy and the required ramp rate may be relatively low. The drying time can be decreased by using small silver flakes, which are packed more densely than large flakes and thus permit a faster rate of evaporation. However, when small flakes are used, cracks are likely to form in the bond because sintering tends to proceed too quickly. Thus, effective attachment of a large die to a substrate using conventional methods generally requires the use of large silver particles, and, therefore, a lengthy drying process and use of a relatively low temperature ramp rate.

SUMMARY OF THE INVENTION

The pastes of the invention permit the elimination of the preliminary drying step and faster overall processing to provide a void- and crack-free bond layer for die attachment, even for large dies. These pastes can be used effectively in a single pass through the furnace at a high temperature ramp rate without sacrificing performance requirements. Other advantages of the present pastes will be hereinafter apparent.

Broadly speaking, the pastes of the invention are characterized by including, along with the basic paste components (silver flake, glass frit, resin and vehicle) a small amount of one or more metallo-organic compounds commonly referred to as metal resinates. The pastes of the invention preferably, but not necessarily, may also include one or more ionic or nonionic surfactants which have both a lyophobic group and a lyophilic group. Metal resinates have been found to reduce cracking in the paste and/or increase the adhesion strength of the paste. Surfactants, the use of which in silver-based pastes is disclosed in co-pending U.S. Application 07/248,120, have been found to enhance stability of the paste so as to avoid or minimize aggregation or settling of the silver and glass particles with consequent overall improvement in the performance of the paste. While the resinate may be effectively used without the surfactant, it has been found that the combination of the metal resinate and surfactant is especially effective towards enabling the use of the paste for bonding large dies, e.g., dies over about 400 square mils, without requiring a preliminary drying step and using a relatively fast ramp rate (e.g., 90° C./min) to give a bond layer which is essentially free from voids and/or cracks.

The silver and glass components in conventional pastes have a tendency to flocculate because of Van der Waals attractive forces, resulting in an increase in free energy of the system when the silver and glass particles are separated from each other. It appears that by using the surfactant additive containing both a lyophobic group which has very little, if any, attraction for the solvent or organic vehicle and a lyophilic group which has a strong attraction for the vehicle, the tendency for flocculation to occur is reduced and paste stability consequently is enhanced. Without intending to be limited to any particular theory of operation, it appears that the lyophobic group of the surfactant is adsorbed onto the surface of silver or glass particles to form a stearic barrier to the vehicle while the lyophilic portion or "tail" of the surfactant extends into the vehicle or stearic layer. Flocculation of particles is inhibited by thickening the stearic barrier and physically keeping dispersed particles apart and by reducing the efficiency of inter-particle collision. This results in enhanced paste stability with consequent advantages as noted above, e.g., the possibility of eliminating the drying step, faster heating rates with reduced time to obtain a void-and-crack-free bond between silicon die and substrate.

A paste which includes only the surfactant combined with the conventional ingredients works well for bonding dies up to about 400-500 square mils using a high temperature ramp rate, without using a drying step. However, the bond layer of larger dies, may tend to have voids and/or cracks unless a drying step, e.g., often about 2 hours or more, is conducted, followed by the use of a low temperature ramp rate, even when a surfactant has been added.

The present invention is based on the finding that the addition of a metal resinate to a silver-based paste of the type indicated will give certain unique advantages. For example, the resinate can be used in a paste comprising small silver flakes, glass frit, organic resin or component therefor, vehicle and surfactant to provide an effective bond without requiring a drying step. In the firing process, organics are burned off, leaving a thin metal coating on the silver and glass and thereby reducing the sintering rate of the paste. A relatively fast ramp rate e.g., about 90° C./min, can be used. By reducing the sintering rate, cracking can be substantially prevented. An additional advantage in using resinates according to the invention is the provision of increased bond strength. Other advantages of the invention will also be apparent.

Metal resinates for use in the invention constitute a well-known class of compounds. Broadly speaking, they comprise an organic metal solution made up of an organic molecule containing a metal at one or more sites. One method to produce the resinate is by reacting any of several organic compounds with a metal salt. Many different types of metal resinate compounds are within the scope of this invention, the important characteristic of the resinate being that a high purity metal is provided for use in organic solution.

According to this invention, silver flakes having a surface area of about 0.8-1.5 m$^2$/g preferably are used, providing for better packing than occurs with larger flakes, and therefore effecting faster evaporation of vehicle without causing voids. While the use of smaller size flakes in conventional processing tends to cause cracks in a bonding layer if sintering occurs too quickly upon firing, addition of a metal resinate has been found to eliminate cracks and/or enhance adhesion when the smaller sized silver flakes are used.

The resinate-containing paste of this invention can be used to bond dies of various sizes. However, the paste is particularly useful for bonding large dies which would normally require a drying step in processing if the resinate is not used.

DETAILED DESCRIPTION OF THE INVENTION

Preferably the metal resinate which is used is one which does not dissolve in silver at the sintering temperature. This appears to ensure that the best adhesion results. Such resinates include cobalt, rhodium and iridium resinates. However, other metal resinates, such as barium, magnesium, calcium and lead resinates, may also be used. Apparently the resinate functions by coating the silver flake. Accordingly, while the amount of resinate used can be widely varied, for best results, a sufficient amount should be used to essentially coat all of the silver flake. Generally speaking, this will amount to about 0.01 to 5%, preferably up to 0.1% by weight of metal resinate based on the total weight of the paste. Useful resinates are commercially available. See, for example, a brochure entitled "Pure Metal Resinates", Engelhard Industries Division, Engelhard Minerals & Chemicals Corporation; and paper entitled "How to Apply Noble Metals to Ceramics", by Hopper, Ceramic Industry, June 1963. In general, suitable metal resinates are those which are stable at temperatures above about 300° C.

The metal resinate can be added at any convenient stage in the formulation of the paste. In one preferred embodiment, the silver flake, metal resinate and vehicle are mixed together with surfactant, if used, and the glass added thereafter. Alternatively, however, all of the paste components may be mixed together at one time until a homogeneous formulation is obtained. Usually low shear mixing for 2-6 hours is adequate to provide a homogeneous composition.

If used, the surfactant should preferably include both a lyophobic group and a lyophilic group and should be stable at temperatures above about 300° C., i.e., close to or above the temperature where sintering of the silver-glass mix begins. Advantageously the lyophobic group is a long chain hydrocarbon radical while the lyophilic group is an ionic or highly polar group. As examples of lyophobic groups, there may be mentioned:

$C_9$-$C_{20}$ straight or branched chain alkyl;

phenyl groups substituted with $C_8$-$C_{20}$ alkyl;

naphthyl groups substituted with alkyl containing 3 or more carbons;

rosin derivatives;

high molecular weight propylene oxide polymers (polyoxypropylene glycol derivatives); or the like.

As the lyophilic component, there may be mentioned such nonionic materials as the monoglyceride of long chain fatty acids of the formula RCOOCH$_2$CHOCCH$_2$OH where R is a long chain alkyl (e.g., $C_{12}$ or more) and/or polyoxyethylenated alkyl phenols of the formula R—C$_6$H$_4$)OC$_2$H$_4$)$_x$OH where R is alkyl of 8 to 20 carbons and x is an integer, e.g., from 1 to 70, sulfated derivatives thereof and the alkali metal salts of such derivatives.

As specific examples of surfactants containing both lyophobic and lyophilic groups suitable for use herein, there may be mentioned: Triton X (the sodium salt of an octylphenol which is ethoxylated and sulfated), Pluronic (ethylene oxide propylene oxide block copolymer), Tetronic (fatty amine ethoxylate), Post-4 (hydrogenated castor oil), Tinagel (fatty amine ethoxylate), and Lecithin ($\beta$-N-alkylamino propionic acid).

The amount of surfactant used can be relatively widely varied and will depend, at least to some extent, on the surfactant employed. Usually, however, the surfactant will comprise from 0.05-2% by weight of the paste, i.e., based on the total weight of silver, glass, resin, vehicle, surfactant and metal resinate. The surfactant may be added at any convenient stage in the formulation of the paste.

Apart from the addition of the metal resinate, and the optional but preferred use of a surfactant as described, the paste includes conventional components. The silver flake used in the present pastes may be of the type conventionally used in the art. Typically such flake has a surface area of 0.4-1.5 m$^2$/g and a tap density of 2.5-4 0 gram/cc. For present purposes, it is desirable that the silver flake is essentially uniform in size although variations may result in the flake as milled. The amount of flake used can be varied but usually will fall in the range of 55-75%, based on the total weight of the paste.

The glass component may be lead borate glass frit which is silica- and sodium-free. Normally this glass will comprise a lead borate frit having a softening point in the range of 325°-425° C., a coefficient of thermal expansion no higher than about 15 ppm/° C., a surface area of at least about 0.3 m²/gm and a tap density of up to about 4 gm/cc. Usually the glass will comprise about 10-25% of the weight of the paste.

As an alternative, a lead phosphate vanadate glass may be used as described in U.S. Pat. No. 4,996,171.

A variety of different organic resin components can be used for present purposes. This includes lower alkyl methacrylates such as methyl, ethyl or isobutyl methacrylate, the latter being preferred. This component usually comprises from about 0.5-2.0% by weight of the paste.

The composition of the organic vehicle can be widely varied. However, the vehicle should be one which has a boiling range of 120°-200° C. This allows for a one pass paste that requires no drying. A particularly useful solvent comprises an alcohol, notably 2-octanol, preferably in mixture with minor amounts (e.g., 1-20% by weight of the solvent total) of additives such as benzyl alcohol and 4-hydroxy-3-methoxy benzaldehyde. Other solvents include ethylene glycol diacetate (EGDA), 2,2,4 trimethylpentanediol-1,3 monoisobutyrate (Texanol), Terpineol and Isopar L (a petroleum distillate hydrocarbon having a broad range of boiling point from 170 to about 200° C.). Normally the paste will include 10-20% vehicle, on a weight basis.

Other additives may also be included in the pastes of the invention, e.g., silver oxide, a thixotrope such as Thixin R, or the like, without departing from the invention.

The invention is illustrated, but not limited, by the following examples showing preparation and use of representative compositions of the invention:

EXAMPLE A

The following composition was prepared by blending together the indicated components in the amounts stated in weight percent:

| | |
|---|---|
| silver flake | about 69% |
| lead borate glass | about 17% |
| polyisobutyl methacrylate | about 1% |
| ethylene glycol diacetate | about 5.5% |
| 2,2,4 trimethylpentanediol-1,3 monoisobutyrate (Texanol) | about 7% |
| Triton X 100 | about 0.5% |

This composition, designated A, does not contain any metal resinate, and was used for comparison purposes as described below.

EXAMPLE B

Example A was repeated except that 0.5% of commercially available Rh resinate was included in the composition to give a composition B.

EXAMPLE C

Example B was repeated except that the Rh resinate was replaced by 0.5 weight percent of Co resinate.

EXAMPLE D

Example B was repeated except that 0.5 weight percent Pd resinate was used as the additive in place of the Rh resinate.

EXAMPLE E

Example B was repeated except that in this case the metal resinate was 0.5 weight percent Ba resinate.

EXAMPLE F

Example B was repeated except that 0.5 weight percent of Pb resinate was used in place of the Rh resinate.

The compositions of Examples A-F were used to bond a conventional silicon die to a bare ceramic substrate. The process used involved applying the paste to a die cavity on the ceramic substrate, placing the die on the paste and passing the resulting package through a conventional belt furnace to bond the die to the substrate. The ramp rate was about 90° C./min. No preliminary drying step was used. The furnace was operated at a peak temperature of 430° C. The firing process was completed in 20 minutes. After cooling, the bond between the die and substrate was examined for percentage voids, percentage cracks and adhesion (lbs. per inch). The results are tabulated below:

TABLE 1

| Composition | % Additive | % Void | % Crack | Adhesion (lb/inch) |
|---|---|---|---|---|
| A | 0 | 2 | 100 | 17 |
| B | 0.5 (Rh) | 0 | 0 | 49 |
| C | 0.5 (Co) | 0 | 5 | 31 |
| D | 0.5 (Pd) | 2 | 75 | 3.3 |
| E | 0.5 (Ba) | 0 | 100 | 74 |
| F | 0.5 (Pb) | 0 | 100 | 34 |

The foregoing results show that in each instance the use of metal resinate (Examples B-F) gave a bond with significantly fewer voids or cracks and/or with greater adhesion.

It is to be noted that the Rh and Co resinates function to improve both anti-cracking and adhesion. These resinates are insoluble in the silver. The Pd resinate is soluble in silver and therefore goes into solution at the sintering temperature of 200° C. and above. This apparently accounts for the reduced adhesion resulting from the use of the Pd resinate under the indicated test conditions.

While the foregoing examples have illustrated the invention using a paste based on lead borate glass, the invention may be used with other types of glasses as indicated earlier. In this connection, it has been found particularly advantageous to use a metal resinate and optionally a surfactant as defined in U.S. application Ser. No. 07/248,120 with a lead phosphate vanadate glass as disclosed in U.S. Pat. No. 4,996,171, incorporated herein by reference. In certain circumstances, pastes based on lead borate glass which usually require firing temperatures of about 420°-430° C., may result in processing problems for certain types of packages, for example, undesired nickel diffusion in solder seal packages. Some other types of packages may also require lower firing temperatures in the order of 350°-380° C. In such cases, it has been found advantageous to use a lead phosphate vanadate glass which can be fired at temperatures as low as, for example, 350° C. Typical such pastes according to the invention would comprise the following on the basis of the total weight of paste:

(1) about 55-80% by weight of silver flake as previously described having a surface area between 0.4-1.5 m$^2$/g and a tap density ranging from 2.5-4 g/cc;

(2) from about 8-20% by weight of lead phosphate vanadate glass having a softening point of 250°-350° C.; surface area of at least 0.3 m$^2$/g; a tap density of about 2.5 g/cc;

(3) from about 0.05 to 2% by weight of a surfactant as described in Serial No. 07/248,120 which is either an ionic or non-ionic surfactant containing both hydrophobic and hydrophilic groups, e.g. Triton X, Pluronic, Tetronic, etc.;

(4) from about 0.05-2% by weight metal resinate, e.g. barium, magnesium, calcium or other glass wetting agent;

(5) 10-20% by weight of solvent or liquid vehicle with a boiling temperature in the range of 120°-220° C., preferably to permit a one pass process with no drying.

As an example of such composition, there may be mentioned the following where percentages are by weight:

| | |
|---|---|
| silver flake | about 76% |
| lead phosphate vanadate glass | 10% |
| isobutyl methacrylate | 0.5% |
| benzyl alcohol | 7.5% |
| ethylene glycol diacetate | 5.0% |
| Triton X100 | 0.5% |
| Barium resinate | 0.5% |
| | 100% |

The use of this paste to bond a 300 mil die using a ramp rate of 40° C./min and a peak temperature of 360° C. for 5-8 minutes gave a void-free, crack-free bond with an average adhesion value of 42 compared with average adhesion values of 22 and 34, respectively, for similar pastes (a) without the Triton and resinate; and (b) with the Triton but without resinate. Void-free and crack-free bonds were obtained in each case.

A further paste modification which is contemplated herein is to provide a particularly desirable form of organic vehicle. Normally, the organic vehicle of silver-filled glass pastes comprises a liquid solution of polymer resin and solvent, and its mixture with silver and glass results in the desired paste form. The common method of die attach involves dispensing the appropriate amount of paste on the substrate and then placing the die on top of the paste. The composite is then passed through the furnace to burn off the organics and to bond the die strongly to the substrate. The dispensing process of silver glass paste is relatively slow.

The further modification contemplated herein is to provide a vehicle which is solid at room temperature (20°-25° C.) and has a melting point of, for example, 70° C. or above. Silver and glass are mixed in this vehicle at a temperature above its melting point. This gives a mixture which is also solid at room temperature but becomes liquid above 70° C.

This type of material can be applied as a liquid onto either the backside of a silicon wafer or substrate cavity at a temperature above 70° C. The paste then solidifies and remains in position until bonding is desired. The wafer or die is then combined with the substrate and heated to effect the desired bonding. In this way, the paste can be applied beforehand as part of the wafer or die fabrication or as part of the preparation of the substrate. This makes the die attachment itself much faster and more precise. In the bonding process, the solid organic vehicle is burned off completely at 250° C., similar to the case where a conventional vehicle is used, leaving the inorganic silver glass for bonding to the die and substrate.

A representative solid vehicle according to this further modification is the following where percentages are by weight.

| | |
|---|---|
| stearyl alcohol | about 65% |
| paraffin wax | 20% |
| Elvacite 2042 | 10% |
| Triton X100 | 5% |

This vehicle is solid at room temperature but melts at about 70° C. to provide effective bonding. A typical paste containing such vehicle may comprise, for example, 64% silver flake, 16% glass, 20% vehicle, where percentages are by weight. It will be appreciated that this aspect of the invention is not limited to the specific vehicle and paste composition described above. In particular, other vehicles which are solid at room temperature and melt at, for example, 65°-80° C., may also be used for present purposes.

Further embodiments of the present invention are shown in following Example G and H. The compositions of these examples are designated as G and H. These compositions allow faster processing which provides a void and crack-free bond layer for die attachment, even for large dies. Compositions G and H are representative of compositions which include 55-80% silver flake, 5-25% glass mixture, 0-2% resin and 0.05-2% surfactant, by weight of the paste. These compositions can be used effectively in a single pass through a furnace at a temperature ramp rate as high as 90° C./min and over a range of firing temperatures from 350°-450° C. Composition G and composition H are as follows:

EXAMPLE G

| | |
|---|---|
| Silver flake | 74% |
| Mixture of glasses | 13 |
| Ethylene glycol diacetate | 6. |
| Texanol | 3 |
| Terpineol | 3 |
| Polyisobutyl methacrylate | 0.5 |
| Surfynol GA surfactant | 0.5 |

EXAMPLE H

| | |
|---|---|
| Silver flake | 74 |
| Glass mixture | 13 |
| Isopar L | 12.2 |
| Thixin R (hydrogenated castor oil) | 0.3 |
| Triton X-45 | 0.5 |

With respect to compositions G and H, the silver flake has a surface area of 0.2-2 m$^2$/g and preferably 0.39 m$^2$/g; and tap density of 2.5-5.5 g/cc and preferably 4.56 g/cc.

The glass mixture of the above compositions contains two different glasses, lead phosphovanadate and lead telluride vanadate (PbTeV). In general, the use of the metal resin minimizes cracks and the use of PbTeV enables firing at lower temperatures (as low as 350° C.). PbTeV glass is composed of 31.8% PbO, 31.8% $V_2O_5$, 27.2% $TeO_2$ and 9.1% $Bi_2O_3$. The two glasses are added in the paste mixing process at various ratios from 5% to 100% PbTeV. While 100% PbTeV provides acceptable results, it is not a preferred proportion.

In both composition G and H, using a proper ratio of glass mixture, good to excellent die bonding performance is attained at faster processing speed and over a range of processing temperature from 350 to 450° C.

The organic system in composition G uses a mixture of three organic vehicles (solvents) in order to broaden the range of solvent evolution to minimize voids during fast firing. Texanol, ethylene glycol diacetate, and Terpineol (trimethyl 3-cyclohexene-1-methanol) have boiling points of 245, 189 and 220° C. respectively. Composition H uses Isopar L solvent which is a petroleum distillate hydrocarbon also having a broad range of boiling point from 170° to about 200° C.

Surfactants are used in both composition G (surfynol GA (tetramethyldecyndiol)) and composition H (Triton X45) to eliminate cracks and enhance paste stability.

The use of one or more solvents having a broad range of boiling points improves the metal resin compositions by minimizing voids.

The simultaneous presence of the glass mixture and solvent mixture having a broad range of boiling points causes faster processing with less voids and higher adhesion, as shown by the following test results:

| Solvent Boiling Range | % Void | Adhesion (lb/inch) | % Cracks |
|---|---|---|---|
| 240-245° C. | 40 | 15 | 0 |
| 175-185° C. | 10 | 10 | 0 |

| Solvent Boiling Range | % Void | Adhesion (lb/inch) | % Cracks |
|---|---|---|---|
| 175-245° C. | 3 | 66 | 0 |
| Process Profile: | Ramp rate: | 90° C./min. | |
| | Peak temperature: | 420° C. | |
| | Die size: | 25° × 28° mils arc based | |
| | Substrate: | alumina | |

The invention is defined in the following claims.

We claim:

1. In a silver-glass paste comprising silver flake, organic vehicle, organic resin, surfactant and a glass component, the improvement wherein the glass component comprises a mixture of lead phosphovanadate and lead telluride vanadate.

2. The paste of claim 1 including 55-80% silver flake, 5-25% glass mixture, 0.0-2% resin and 0.05-2% surfactant, by weight of the paste.

3. The paste of claim 1 wherein the surface area of the silver flake ranges from 0.2 to 2 $m^2/g$ and the tap density ranges from 2.5 to 5.5 gram/cc.

4. The paste of claim 1 wherein the surface area of the silver flake is about 0.39 $m^2/g$ and the tap density is about 4.56 gram/cc.

5. The paste of claim 1 wherein the ratio of the two glasses are 5%-95% lead telluride vanadate 95%-5% lead phosphovandate.

6. The paste of claim 1 wherein the lead telluride vanadate glass comprises 31.8% PbO, 31.8% $V_2O_5$, 27.2% $TeO_2$ and 0.1% $Bi_2O_3$.

7. The paste of claim 1 wherein the organic vehicle is a mixture of solvents having a range of boiling points which broaden the range of solvent evolution from the paste.

8. The paste of claim 7 wherein the range of boiling points is 175°-245° C.

9. The paste of claim 7 wherein the mixture of solvents comprises 2,2,4 trimethylpentanediol-1,3 monoisobutyrate, ethylene glycol diacetate and trimethyl 3-cyclohexene-1-methanol.

* * * * *